United States Patent
Seifert et al.

(10) Patent No.: US 7,802,891 B2
(45) Date of Patent: *Sep. 28, 2010

(54) FACETED MIRROR APPARATUS

(75) Inventors: Andreas Seifert, Aalen (DE); Markus Weiss, Aalen (DE); Andreas Heisler, Steinheim (DE); Stefan Dornheim, Heindenheim (DE)

(73) Assignee: Carl Zeiss SMT AG (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/338,049

(22) Filed: Dec. 18, 2008

(65) Prior Publication Data

US 2009/0097142 A1    Apr. 16, 2009

Related U.S. Application Data

(60) Continuation of application No. 11/695,626, filed on Apr. 3, 2007, now abandoned, which is a division of application No. 10/936,317, filed on Sep. 8, 2004, now Pat. No. 7,246,909, which is a continuation of application No. PCT/EP2004/000331, filed on Jan. 17, 2004.

(30) Foreign Application Priority Data

Jan. 24, 2003    (DE)    ................................ 103 02 664

(51) Int. Cl.
    *G02B 5/08*    (2006.01)
(52) U.S. Cl. ........................ 359/850; 359/855; 359/865

(58) Field of Classification Search ....................... None
See application file for complete search history.

(56) References Cited

U.S. PATENT DOCUMENTS

| 6,266,389 | B1 * | 7/2001 | Murayama et al. ............ 378/34 |
| 7,034,998 | B2 | 4/2006 | Melzer et al. |
| 7,354,168 | B2 | 4/2008 | Holderer et al. |

FOREIGN PATENT DOCUMENTS

| DE | 100 30 495 A1 | 1/2002 |
| EP | 0145 243 A2 | 6/1985 |
| WO | 03/050586 A2 | 6/2003 |
| WO | 03/067304 A1 | 8/2003 |

OTHER PUBLICATIONS

"XP-002281181—Ion Beam and Plasma Jet Etching for Optical Component Fabrication," Schindler; Haensel; Flamm; Frank; Boehm; Frost; Fechner; Bigl; Rauschenbach; pp. 217-227; Lithographic and Micromachining Techniques for Optical Component Fabrication, Ernst-Bernhard Kley, Hans Peter Herzig, Editors (2001).

* cited by examiner

*Primary Examiner*—James Phan
(74) *Attorney, Agent, or Firm*—GrayRobnson, P.A.

(57) ABSTRACT

A faceted mirror apparatus includes a support plate having a plurality of stepped reception bores into which are fitted the base portions of respective ones of a plurality of mirror facets having mirrored surfaces. An outer surface of each of the facets bears on an inner wall to provide a stable alignment of the optical axes of the mirrored surfaces such that the apparatus generates a beam of rays from impinging rays.

58 Claims, 6 Drawing Sheets

FACETED MIRROR APPARATUS

This application is a continuation of U.S. application Ser. No. 11/695,626 filed Apr. 3, 2007 now abandoned which is a divisional of U.S. application Ser. No. 10/936,317 filed Sep. 8, 2004, which issued Jul. 24, 2007 as U.S. Pat. No. 7,246,909, and which in turn is a continuation of International Application No. PCT/EP2004/000331 filed on Jan. 17, 2004 which designates the U.S. and claims priority to German Application No. 103 02 664.9 filed Jan. 24, 2003.

BACKGROUND OF THE INVENTION

The invention relates to faceted mirrors having a plurality of mirror facets, in particular for an illumination instrument in a projection exposure system for microlithography, and here in particular for use with illumination in the extreme ultraviolet range.

Faceted mirrors comprise a plurality of mirror facets and are already known in the prior art.

Prior citation WO 03/067304 is based on manipulators which allow adjustment of the mirror facets. For example, it is known that the mirror facets have a spherical body, a mirror surface being arranged in a recess of the spherical body and the side of the spherical body remote from the mirror surface being mounted in a bearing instrument. At each of the mirror facets, a lever element is arranged on the side of the spherical body remote from the mirror surface. Adjusting means, by which the spherical body can be moved about its mid-point, engage on the lever element in a region remote from the spherical body.

With a structure of this type, it is not readily possible to achieve the requisite accuracies for relatively small mirror facets when used with radiation in the extreme ultraviolet range.

Mirror facets whose mirror surfaces are arranged on a support element are furthermore known from prior citation WO 03/067288. The support element has adjusting means by which the angular position of the mirror surface can be adjusted in at least one space direction in a plane at least approximately perpendicular to the optical axis of the mirror surface.

For further prior art, reference is made to WO 03/050586 A2, DE 100 30 495 A1, EP 0 145 243 A2 and XP-002281181 "Ion Beam and Plasma Jet Etching for Optical Component Fabrication" in Lithographic and Micromachining Techniques for Optical Component Fabrication, Ernst-Bernhard Kley, Hans Peter Herzig, editors, Proceedings of SPIE Vol. 4440 (2001).

The structure of these mirror facets is relatively elaborate, so that such faceted mirror arrangements entail an increased adjustment outlay and are relatively expensive.

Faceted mirrors need to withstand heavy thermal loads due to the radiation, especially in the extreme ultraviolet range, and the known arrangements meet the stringent requirements concerning thermal loads only to a small extent.

In respect of this, it is an object of the invention to optimize a faceted mirror, especially for ultrahigh vacuum requirements, and to provide a structure which makes do with the fewest possible parts and guarantees a reliable, long-term stable and simple structure.

SUMMARY OF THE INVENTION

According to the invention, in a method for the production of a faceted mirror having a plurality of mirror facets which generate a beam of rays, the mirror facets having mirror surfaces each with an optical axis, and they are each fitted into reception bores of a support plate, this object is achieved in that the mirror facets are made in a first method step, after which at least one of the mirror facets is fitted into the associated reception bore of the support plate in a second method step, after which the ACTUAL position of the optical axis of at least one mirror surface of an associated mirror facet fitted into the support plate is determined in a third step and compared with a SET position of a predetermined optical axis, after which, knowing the measured values determined for the at least one mirror facet in the third method step, reprocessing of the mirror facet and/or of the reception bore is carried out in a further method step if there is an angular deviation between the ACTUAL position and the SET position.

The respectively selected optical axis can be determined via a reference face according to the invention. For example, an arbitrarily picked mirror surface of a mirror facet fitted into the support plate may be used as a reference face. Further mirror facets, and preferably all of them, are then aligned with their mirror surfaces with respect to the mirror surface thus acting as a reference face in order to achieve the required beam of rays, which likewise has a principal optical axis.

Instead of a mirror surface as the reference face, a reference face may also be provided on the support plate, with respect to which further mirror surfaces, and preferably all of them, are aligned with their respective optical axes in order to generate the intended beam of rays. A plurality of reference faces may furthermore be used for alignment of the mirror facets. This is particularly advantageous when the mirror facets are aligned in groups. Method steps two, three and the further method step may be carried out either individually, successively in groups or even all together for the mirror facets to be fitted into the reception bores of the support plate.

Very advantageous reprocessing can be carried out by so-called ion beam figuring (IBF). This is controlled, highly accurate surface smoothing by ion beams in order to reduce the roughness and for extremely exact surfaces. Any angular deviation from the intended angle can thereby be reduced further.

As an alternative, it is also possible to carry out the reprocessing by evaporation of metal interlayers, for example gold layers. The metal layers are then correspondingly evaporated onto the mirror facet and/or support plate, so that any angular deviations are reduced further.

In another method according to the invention for the production of a faceted mirror having a plurality of mirror facets which generate a beam of rays, the mirror facets having mirror surfaces each with an optical axis, and they are each fitted into reception bores of a support plate, the mirror facets may be made in a first method step, after which at least one of the mirror facets is measured by a measuring device in a second method step, after which, knowing the measurement result, the associated reception bore is formed in the support plate, after which the at least one mirror facet is fitted into the associated reception bore of the support plate in a third method step, after which the ACTUAL position of the optical axis of the at least one mirror surface of the mirror facet fitted into the support plate is determined in a fourth step and compared with a SET position of a predetermined optical axis, after which, knowing the measured values determined for the at least one mirror facet in the fourth method step, reprocessing of the mirror facet and/or of the reception bore is carried out in a further method step if there is an angular deviation between the ACTUAL position and the SET position.

In this method according to the invention, knowing these values, the associated reception bore is formed in the support plate by using the measured values obtained in the second method step for the at least one measured mirror facet with respect to its optical axis, after which the fine tuning and optional reprocessing in order to achieve a best-possible fabrication accuracy are carried out in the further method step.

In this exemplary method as well, the mirror facets may be measured individually or successively in groups or even all together. The same applies to the reception bores determined with the aid of the measured values being formed in the support plate.

In order to achieve the requisite accuracy, the fabrication is thus performed in steps. The individual facets are first made to within the best-possible angular error, for example 200". This deviation is then determined by a measuring device, for example an angle measuring instrument, preferably with an autocollimation telescope with a positioning stage. The reception bores for the mirror facets are then formed in the support plate with the best-possible fabrication accuracy, which is from 20" to 100", preferably from 30" to 50". It is then possible to establish directly which of the mirror facets will be fitted with which of the previously measured angular errors into which of the reception bores. If need be, the reception bores may therefore be corrected directly according to the measured angular errors of the mirror facets. The residual error after the mirror facets have been fitted into the respective reception bores is in turn determined via an angle measuring instrument. Owing to the fabrication accuracies to be achieved, this error lies in a range that makes it possible to correct the residual error via a precision surface processing method, for example the IBF method or the evaporation of metal interlayers.

It is thus possible to achieve the requisite quality concerning alignment of the individual mirror facets. The mirror facets are subsequently fixed in the support plate so that a stable alignment is guaranteed even over a long period of time. Furthermore, the direct contact between the mirror facet and the support plate leads to a structure which ideally dissipates the heat absorbed by the mirror facets. This allows a simpler, less expensive, very stable, less shock-sensitive, material-reducing, adhesive-free and thermally unproblematic structure of a faceted mirror in the ultrahigh vacuum range, especially for use in EUV lithography.

Compared to solutions with individual manipulators for the mirror facets, the method for the production of faceted mirrors not only has advantages concerning a low assembly and adjustment outlay and inexpensive production, but this method also makes it possible to produce substantially smaller faceted mirrors and to arrange a very large number of them in a faceted mirror, a diameter range of from 3 mm to 50 mm being readily achievable for the mirror facets.

DETAILED DESCRIPTION OF THE DRAWINGS

DETAILED DESCRIPTION

Figure 1:
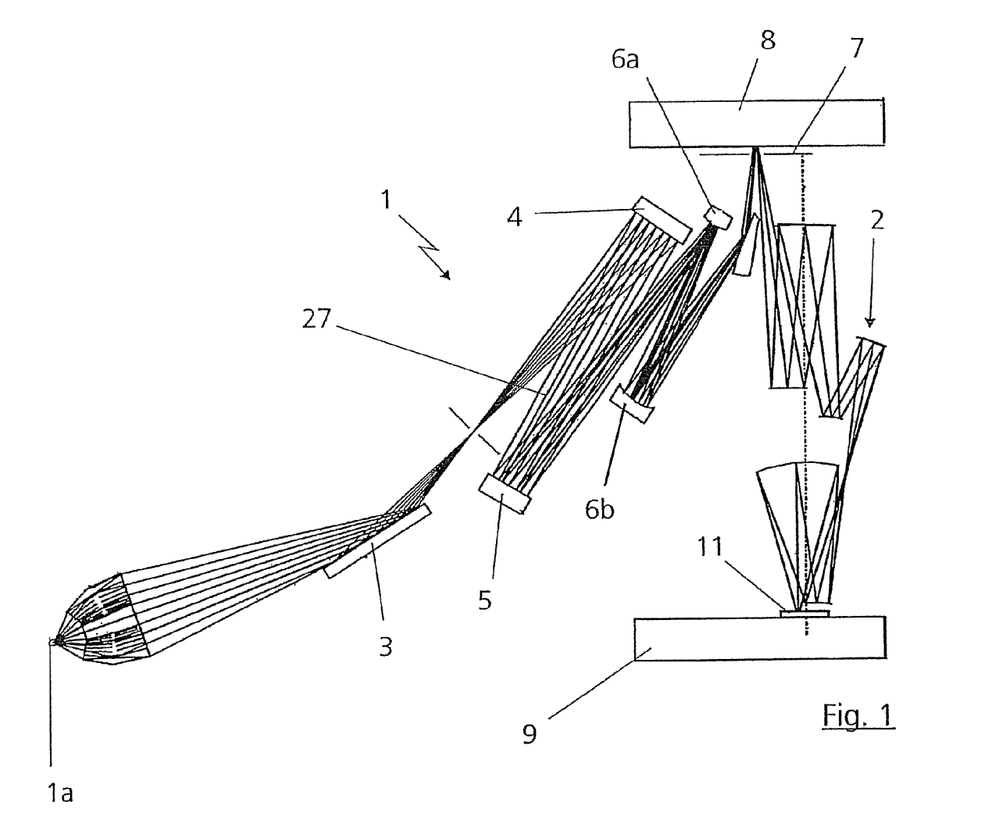
FIG. 1 shows a structure of an EUV illumination instrument with a light source, an illumination instrument and a projection objective.

FIG. 1 shows a summary representation of an EUV projection exposure system with a complete EUV illumination instrument 1 with a light source 1a and a projection objective 2 (only briefly represented). The illumination instrument 1 also contains a plane mirror 3, a first faceted mirror 4 as a first optical element with a multiplicity of faceted mirrors, a subsequently arranged second faceted mirror 5 as a second optical element with a multiplicity of faceted mirrors, and two imaging mirrors 6a and 6b. The imaging mirrors 6a and 6b are used to image the mirror facets of the faceted mirror 5 into an entry pupil of the projection objective 2. A reticle 7 can be displaced as a scanning system in the y direction. A reticle plane 8 also simultaneously constitutes the object plane.

In order to bring different light channels into the optical path of the illumination instrument for the setting adjustment, for example, there are a greater number of mirror facets on the second faceted mirror 5 than correspond to the number of mirror facets on the first faceted mirror 4. The mirror facets are not represented in FIG. 1 for the sake of clarity. As the object to be exposed, there is a wafer 11 on a support unit 9.

Figure 2:
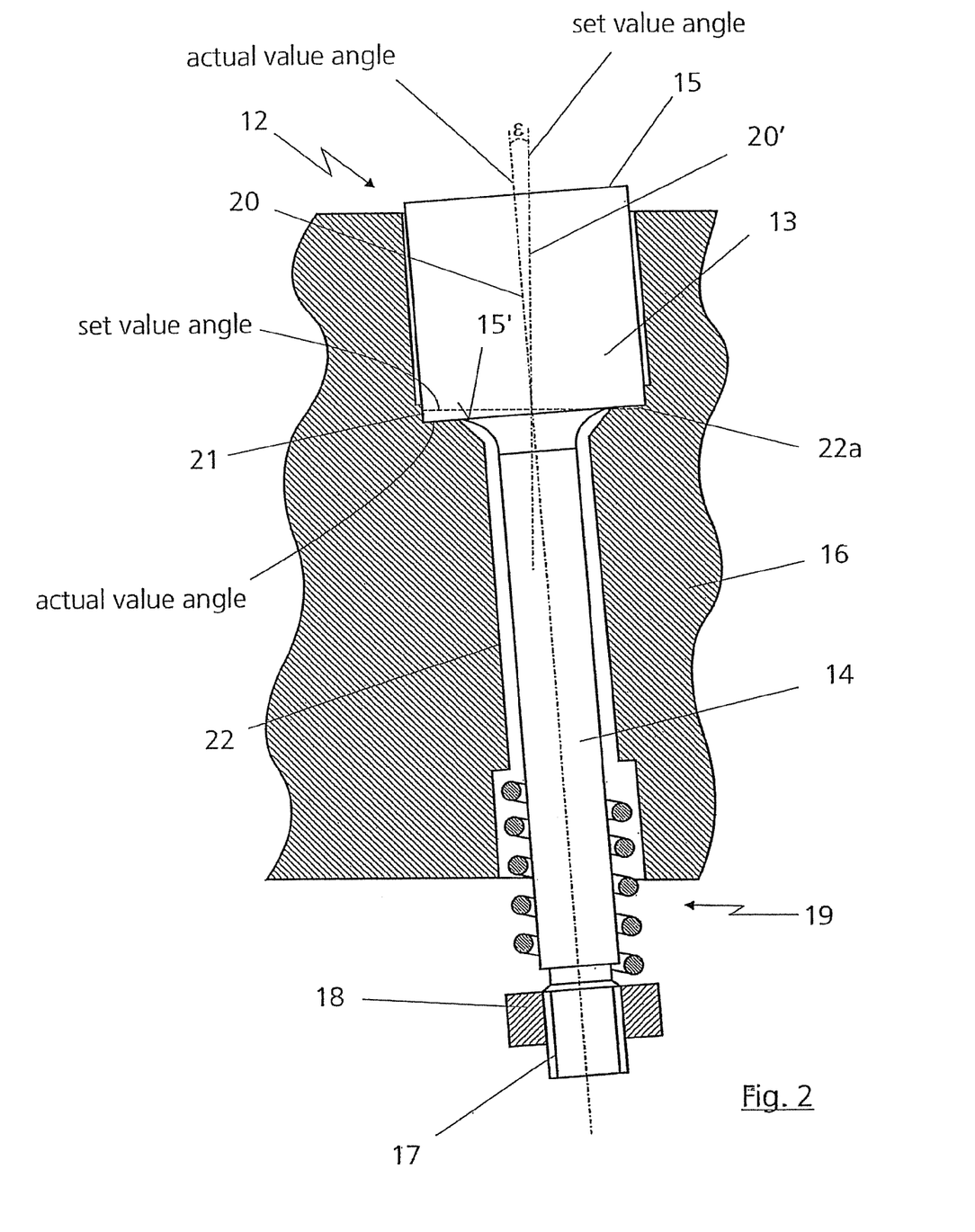
FIG. 2 shows a longitudinal section of a cylindrically designed mirror facet, the mirror facet being mounted in a support plate.

FIG. 2 shows an individual mirror facet 12 with a mirror surface 15, which is formed by a cylindrical mirror facet head 13 and a cylindrical mirror facet base 14. In the exemplary embodiment, the cylindrical mirror facet head 13 has a diameter of for example 20 mm, and the cylindrical mirror facet base 14 has a diameter of about 8 mm. The mirror facet 12 has an overall length of 60 mm, for example. For reasons of processing and thermal loading, silicon is selected as the material of the mirror facet 12. The mirror facet 12 may of course be made of a stainless steel alloy or other materials which meet the requirements for polishability, mechanical, thermal and long-term stability and ultrahigh vacuum compatibility (UHV compatibility). What is important when selecting the materials for the mirror facets 12, in particular, is that the materials being used should have a high thermal conductivity so that the heat generated because of the beam power can be dissipated.

The mirror surface 15 of the mirror facet head 13 may be spherical or concave with a radius of, for example, 2000 mm. The mirror surfaces 15 may also be designed to be plane, spherical, aspherical, convex or concave. A marking 23 (see FIG. 6) is also applied to the mirror surface 15 for correct azimuthal orientation of the mirror facet 12. The marking 23 needs to be aligned with a corresponding marking on a plane support plate 16, which has reception bores 22 for the mirror facets 12. The support plate 16 is used to receive all the mirror facets 12, which together form the faceted mirror 4 or 5. The mirror facets 12 are in this case received individually in a particular reception bore 22. The longitudinal axes of the individual reception bores 22 are generally at different angles with respect to the optical axis, so that an intended beam of rays (see reference numeral "27" in FIG. 1) is obtained overall from the multiplicity of mirror facets 12 fitted into the support plate 16.

The support plate 16 may also be designed to be aspherical, if the mirror facets 12 are not intended to be arranged in a plane. For example, the support plate 16 is formed by steel with a thickness of, for example, 50 mm. The support plate 16 may also be made of other materials, for example silicon, so that good heat dissipation is achieved.

The cylindrical mirror facet base 14 is provided with a screw thread 17 in order to hold the mirror facet 12 in its position with a defined force, for example produced by a threaded nut 18 and a spring 19, after it has been reprocessed. The spring 19 may be formed as a cylindrical spring or as a spring washer made of stainless steel. This is particularly advantageous when materials with different thermal expansion coefficients are being used for the support plate 16 and for the mirror facet 12, as in the present exemplary embodiment.

Owing to the different longitudinal axes of the reception bores 22, the mirror facets 12 are arranged at different inclination angles on the support plate 16, so that the impinging rays are reflected in a predetermined direction in order to generate the beam of rays 27. The optical axis 20 of each mirror facet 12 therefore needs to lie in a particular set direction. For this reason, the mirror surface 15 must be aligned very accurately.

Figure 3:
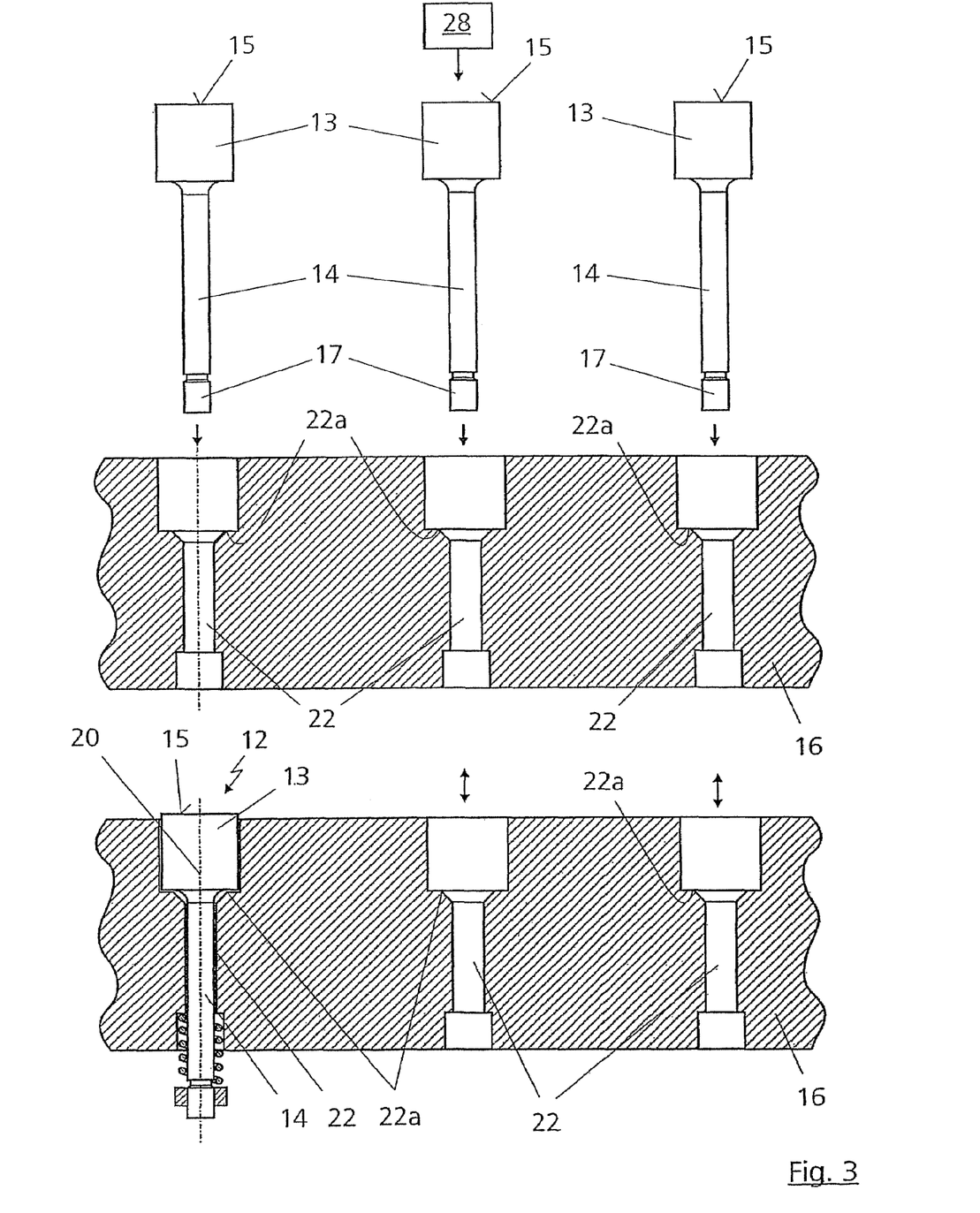
FIG. 3 shows a brief representation relating to a production method for a faceted mirror.

After the mirror facets 12 have been made, for example, the relation between its mirror surface 15 and a mirror back face 15' remote from the mirror surface 15 is measured for each mirror facet 12 by a measuring device 28 (not shown, see FIG. 3). Also, the relation between the lateral face 21 of the mirror facet head 13 and the mirror surface 15 may advantageously be measured so that an error to be corrected can be determined. This means that a set angle direction and an actual angle direction are determined, the difference between them is taken and the angular deviation then needs to be eliminated.

This may be done in a plurality of steps. The first step deals with the reception bores 22. Since the mirror surfaces 15 can only be made with an accuracy of about 200" with respect to the support plate 16, the reception bores 22 are respectively processed at the place of the position-determined lateral faces 21 of the mirror facet 12 until the two relational faces are tilted by the predetermined angular correction (in most cases 200"). The finely processed lateral face 21 with a measured error can then additionally achieve the requisite accuracy of about 10" by evaporating a wedge-shaped metal interlayer.

In addition or as an alternative, if the necessary accuracy has not yet been achieved, it is possible for the mirror surface 15 to be reprocessed by ion beam figuring (IBF).

Optionally, the necessary accuracy may also be achieved only with ion beam figuring, ablation of the face to be treated being carried out in the final processing by ions. The ablation of typically 1 to 2 μm necessary for the IBF processing can be carried out in this processing step without impairing the surface roughness. A final accuracy of about 1" can thus be achieved.

In the exemplary embodiment according to FIG. 2, the reception bore 22 is respectively designed as a stepped bore with a step ledge 22a for matching to the cylindrical mirror facet head 13 and the cylindrical mirror facet base 14. Instead of relational faces exactly assigned to each other between the lateral face 21 and the inner wall of the reception bore 22, a mirror back face 15', that is to say a face on the side of the mirror facet head 13 remote from the mirror surface 15, may respectively be provided as an alternative in this region as an angle-defining guide face in conjunction with the step ledge 22a. Instead of reprocessing the lateral face 21 or the reception bore 22 in the region of the lateral face 21, in this case either the mirror back face 15' or the step ledge 22a is reprocessed. The reprocessing may again be carried out, for example, by ion beam figuring or by application of a metal interlayer on one of the two parts. Since the reprocessing involves angular corrections, during the reprocessing either wedge-shaped IBF ablation or wedge-shaped application of a metal interlayer is carried out in respect of the face to be reprocessed, in order to achieve an angular correction. In other words: On the face to be processed, a layer is applied or ablated which has a different thickness or is ablated obliquely to its surface, in order to generate the intended angular correction.

The alignment of a mirror facet 12 and the reprocessing method will briefly be described below with reference to FIGS. 3, 4a and 4b. In order to be able to determine the exact place and the scope of the reprocessing, one or more mirror facets 12 are fitted, for example provisionally, into the associated reception bores 22 after having been measured by the measuring device 28, and the reflectivity is measured (see FIG. 3 top). In order to use the multiplicity of mirror facets 12 fitted into the support plate 16 to generate the beam of rays 27, which is for example guided to the faceted mirror 5, the mirror facets 12 respectively need to be aligned with their optical axis 20 in a predetermined way. To that end, a reference face should be provided. This may be done, for example, by a mirror surface 15 of a mirror facet 12, as represented for example in FIG. 3 left bottom. In relation to the optical axis 20 of this mirror facet 12, all the other optical axes of the remaining mirror facets 12 are then measured with regard to their respective position and in each case correspondingly aligned so that the mirror facets 12 together lead to the intended beam of rays 27. To that end, as required, processing faces of the mirror facets 12, or of the bores 22 in which they are received, will be reprocessed accordingly.

Figure 4A:
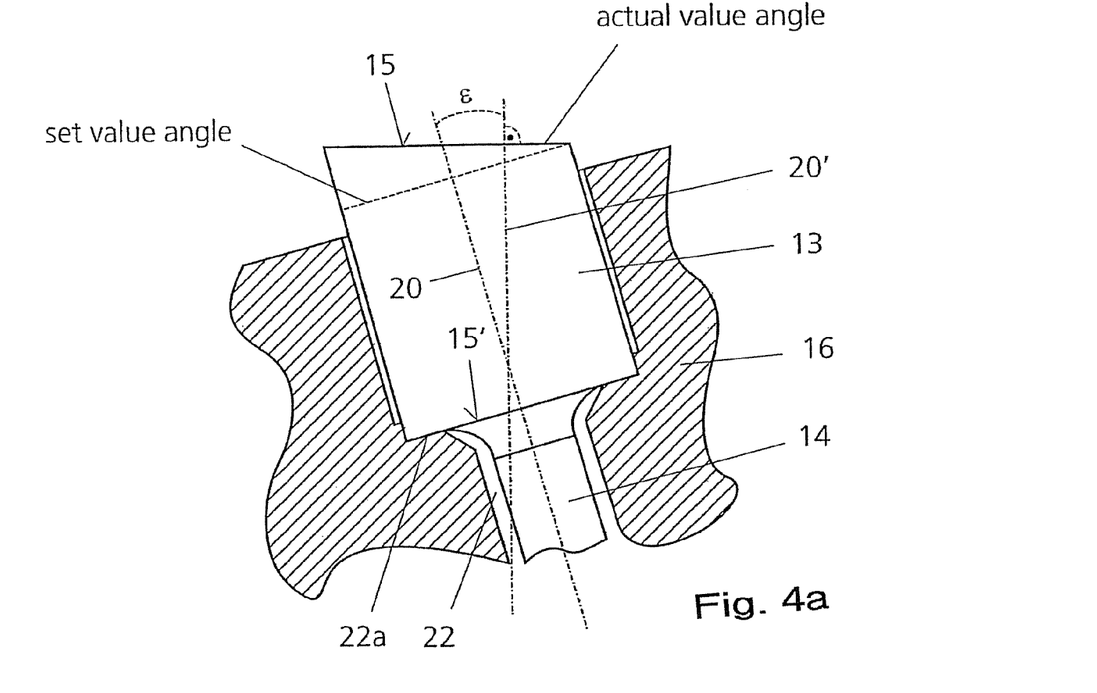
FIGS. 4a and 4b show excerpts of a longitudinal section corresponding to FIG. 2 with examples of reprocessing faces.
Figure 4B:
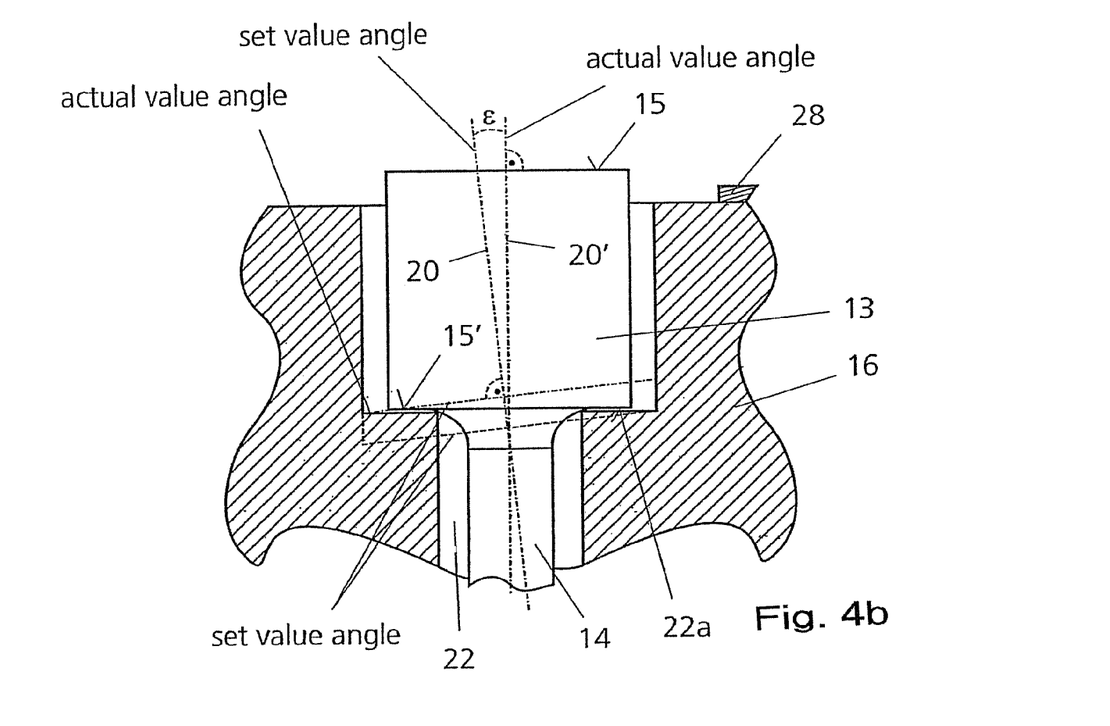

Examples of possible reprocessing faces are represented in FIGS. 4a and 4b. For clearer representation, the angular changes indicated in FIGS. 4a and 4b and the wedge-shaped ablations or applications are indicated greatly enlarged. In practice, the corrections generally take place in the range of up to 100".

According to FIG. 4a, there is an angular deviation $\epsilon$ as the correction angle between the actual position or the actual value of the optical axis 20' and the set position or the set value of the optical axis 20. In order to correct the angular error $\epsilon$, according to FIG. 4a, the mirror surface 15 is therefore ablated accordingly in a wedge shape with the correction angle $\epsilon$.

As an alternative to this, of course, it is also possible to ablate the mirror facet head 13 with the correction angle $\epsilon$ on its back face 15' remote from the mirror surface 15. Since the mirror facet head 13 bears with its back face 15' on the step ledge 22a of the stepped bore 22, the position of the longitudinal axis of the mirror facet 12 is in this way corrected accordingly in the reception bore 22. Of course, a correspondingly large play between the diameter of the stepped bore 22 and the diameter of the cylindrical mirror facet base 14 therefore needs to be provided in the region of the mirror facet base 14, so that there is enough lateral free space for alignment of the mirror facet 12.

FIG. 4b represents another alternative for correction of the deviation of the actual position of the optical axis 20" from the set position of the optical axis 20. Instead of the back face 15', as can be seen, the step ledge 22a is reprocessed here in a wedge shape with the correction angle $\epsilon$ by corresponding ablation. Here again, the position of the longitudinal axis of the mirror facet 12 is in this way corrected accordingly so that the angular deviation is minimized as far as possible—within predetermined tolerance limits. The optimum case would, of course, be when the angular deviation of the correction angle $\epsilon$ becomes 0.

When all the mirror facets have been aligned with their respective optical axes in relation to the reference face, so that they generate the intended beam of rays 27, then it may sometimes still be necessary merely to correct the position of the support plate 16 overall, if the position of the principal axis of the beam of rays still needs to be aligned more accurately with the subsequent faceted mirror.

Instead of the reference face of the mirror surface 15 of the mirror facet 12 according to the representation in FIG. 3 left bottom, of course, any selected measuring face of the support plate 16 may be used as a reference face, relative to which the individual optical axes 20 of the mirror facets 12 will then be aligned. In FIG. 4b, the measuring face is merely represented briefly by the reference numeral 28. The represented measuring or plane face 28 may, for example, be scanned with a coordinate measuring machine and recorded by measuring techniques, after which a relationship with the individual optical axes 20 of the mirror facets 12 is established.

For alignment of the individual optical axes with the reference face, owing to the spatial dimension of the beam of rays, two tilt axes accordingly need to be taken into account when processing the respective reprocessing face. In the example represented in FIGS. 4a and 4b with the correction angle ϵ, the second correction angle is in a plane lying at 90° to the correction angle ϵ.

Instead of the ablation method as represented in FIGS. 4a and 4b, of course, it is also possible to carry out an application method, for example by evaporating metal interlayers which are likewise to be applied in a wedge shape according to the correction angle ϵ. This means, for example, that instead of the wedge-shaped ablation of the step ledge 22a represented by dashes in FIG. 4b, a metal layer is accordingly raised by evaporation in a wedge shape as represented by dots and dashes. In the same way, of course, a wedge-shaped metal interlayer may also be applied to the mirror surface 15 instead of ablation of the mirror surface 15. The same applies to the back face 15'.

When a metal interlayer is to be evaporated, for example, gold may be used for this since it is very highly suitable with respect to a good thermal junction as well as processing and softness, together with adaptation to the shape in question. Other metals may naturally also be used, for example noble metals, gallium, platinum, silver or indium. It is advantageous to pick a metal which can be deposited very easily but nevertheless produces a good thermal contact.

Besides the evaporation of metal interlayers or IBF processing, another option is to rotate the tilted mirror facets 12 and 12' about their longitudinal axes. The effect of rotation is that the correction may then only need to be carried out in one angular direction, so that it is possible to simplify the other process steps. If a higher accuracy can be achieved only in one direction, but not in another direction, then the effect of rotating the mirror facets 12 may be that the accuracy is equally high in all directions. If still necessary, the requisite accuracy may be achieved after this by either ion beam figuring or evaporation of metal interlayers.

Figure 5:
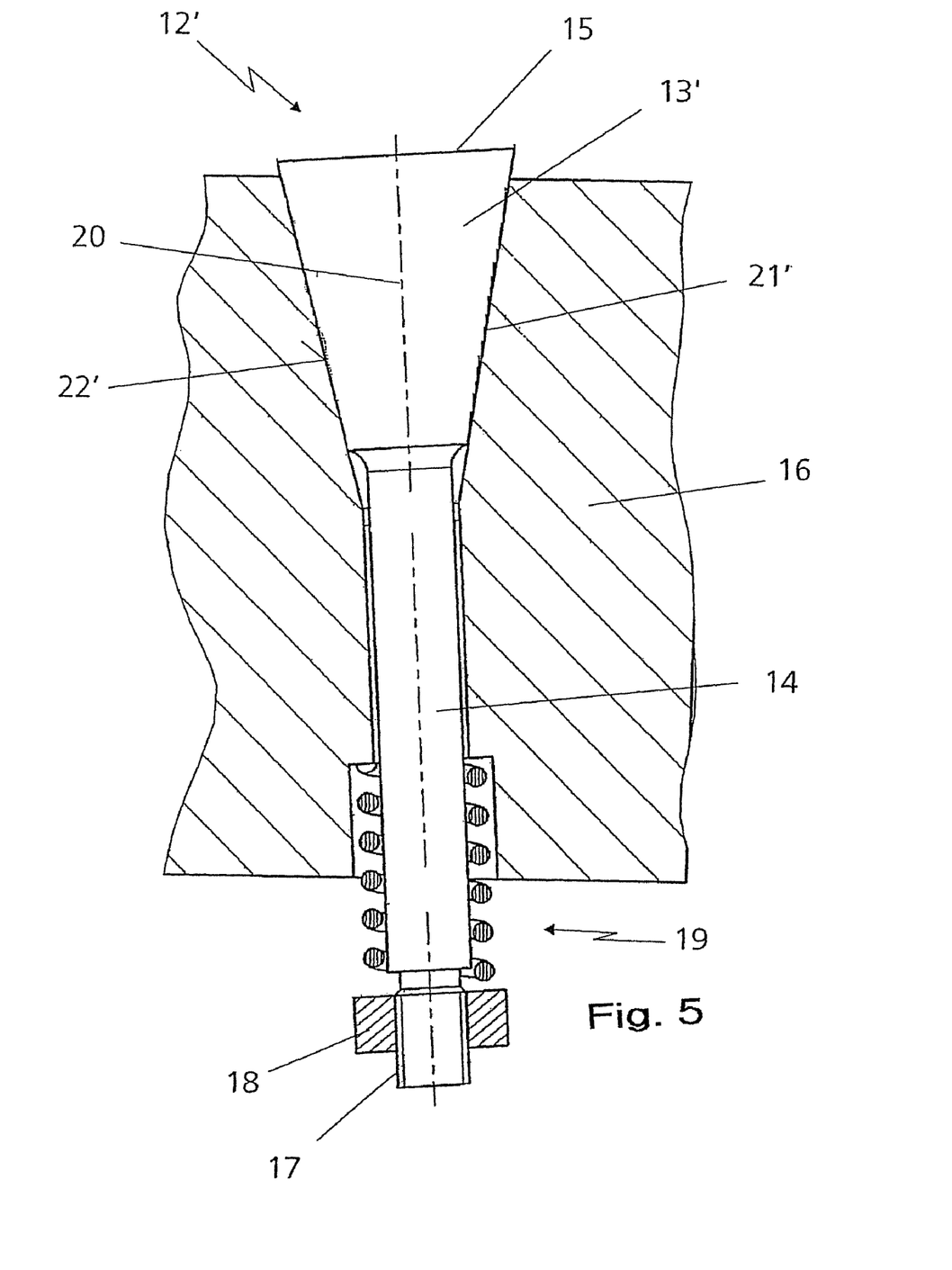
FIG. 5 shows a longitudinal section of a conically designed mirror facet, the mirror facet being mounted in a support plate.

FIG. 5 shows a mirror facet 12' with a conical mirror facet head 13' and a cylindrical mirror facet base 14. Since the structure of the mirror facet and the reception bore correspond essentially to the exemplary embodiment according to FIG. 2, the same reference numerals will also be used for the same parts. The reception bore 22' is accordingly also designed to be conical in the region of the mirror facet head 13' and cylindrical in the region of the mirror facet base 14. The processing steps for the reception bore 22' are carried out in the same steps as when there is a cylindrical mirror facet head 13. It should be borne in mind, however, that the lateral faces 21' must have a very high accuracy since the mirror facet head 13' bears directly on the inner wall of the reception bore 22' via the lateral faces 21'. The application or evaporation of a wedge-shaped metal interlayer for the reprocessing may be carried out on the mirror surface 15 according to FIG. 4a and/or on the conical lateral face 21' or on the reception bore 22' in the region of the lateral face 21'. The same applies to IBF reprocessing.

The conical guide has an essential advantage. It is not self-locking but self-centering, so as to provide a greater bearing region for the mirror facet head 13' on the inner wall of the reception bore 22' and therefore very good heat dissipation. Very steep angles of the reception bore 22' and of the conical mirror facet head 13' are preferred, in order to obtain a very good position definition. The conical mirror facet head 13' may have a radius of, for example, 2000 mm and a diameter of about 20 mm, in each case measured on the mirror surface 15.

Figure 6:
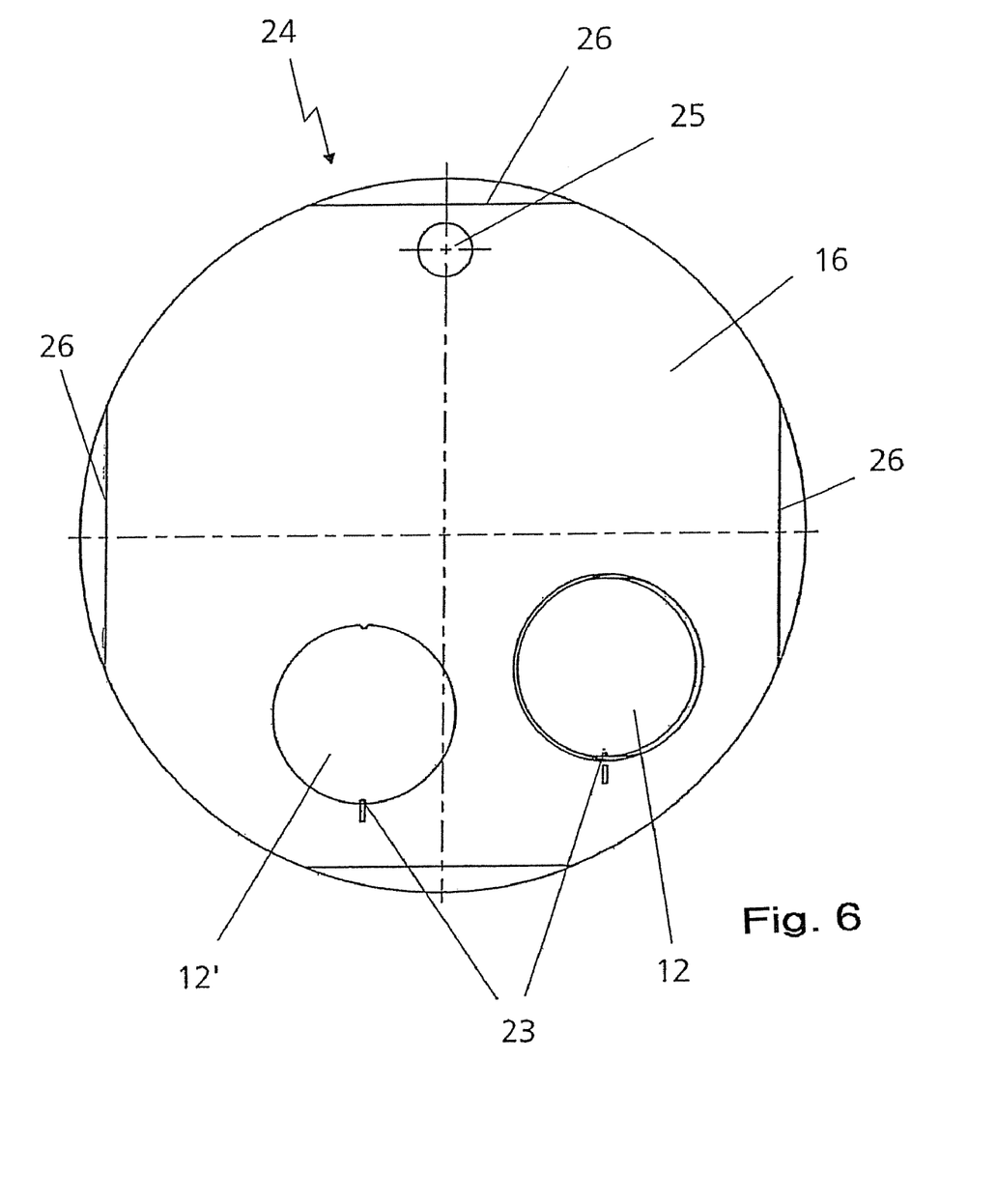
FIG. 6 shows a plan view of a faceted mirror, which contains both embodiments of the mirror facets represented in FIG. 2 and FIG. 3.

FIG. 6 shows a plan view of a faceted mirror 24. The faceted mirror 24 is, for example, respectively represented with a cylindrical mirror facet 12 and a conical mirror facet 12'. For the sake of clarity, only two mirror facets 12 and 12' are actually represented. If need be, of course, there will be substantially more individual mirror facets in a faceted mirror 24. In practice, moreover, there will generally be either only cylindrical mirror facets 12 or only conical mirror facets 12' in one faceted mirror.

The marking 23 for the azimuthal alignment can respectively be seen in the—in the drawing—lower region of the mirror facets 12 and 12'. One or more marking holes 25 or reference faces 26 on the faceted mirror 24 define the relation with a measuring system, in order to align it according to its position in the projection exposure system.

A faceted mirror 24 contains, for example, 200 mirror facets, for example only with cylindrical mirror facets 12 or only with conical mirror facets 12'. However, it is also possible to provide a mixture of cylindrical and conical mirror facets 12 and 12'.

In a faceted mirror 24 with a support plate 16, the plate diameter being about 30 cm, there may be angular differences relating to the respective optical axes 20 of the individual mirror facets 12 or 12' of, for example, 6° with respect to a principal direction. The reprocessing according to the invention is carried out so that the respective optical axis of a mirror facet is as exact as possible. The optical axis is in this case given by the optical effect of the mirror surface as a function of its shape.

For a corresponding angular accuracy of the optical axis, it is therefore necessary for there to be a relation between the mirror surface 15 and the longitudinal axis in the bore 22 of the mirror facet 12. The measurements and corresponding reprocessing operations described above need to be carried out for this reason. In other words: the longitudinal axis 20 of a mirror facet 12 defines the direction, and the mirror surface 15 with its optical axis defines the optical effect. The two axes need to be correlated so that, in operation, the optical axis subsequently lies accurately in the direction that is necessary in order to produce an intended beam of rays from the multiplicity of individual mirror facets 12 or 12'.

In general, the configuration and alignment of the individual mirror facets 12 will be provided so that the normal of the mirror surface 15 corresponds as accurately as possible to the optical axis 20. This may not be necessary in principle, however, since the crucial point is that the respective individual optical axes should be aligned so as to obtain an intended beam of rays 27 which has a corresponding accuracy with respect to the principal optical axis of the beam of rays and the shape and size of the beam of rays.

Since the entire system is operated in a vacuum there should be no blind regions, that is to say no regions which are fully closed, in the region of the reception bores 22 and 22'.

Optionally, V-shaped groves extending in the longitudinal direction may be formed in the reception bores 22 and 22' in order to evacuate the faces 21 and 21'.

What is claimed is:

1. A faceted mirror apparatus, comprising: a faceted mirror having a plurality of mirror facets which reflect impinging rays in order to generate a beam of rays, wherein each of the mirror facets has a mirror surface with an optical axis, and the mirror facets are each fitted into reception bores of a support plate so that the optical axes of the mirror surfaces are respectively aligned in order to generate the beam of rays, each of the facets having an outer surface which bears directly on the inner wall of the reception bore to provide a stable alignment of the facet within the reception bore, wherein the mirror facets each have a cylindrical mirror facet head with a mirror surface and a cylindrical mirror facet base, and they are fitted into stepped reception bores of the support plate with a step ledge.

2. The apparatus of claim 1 wherein the step ledge of the reception bore is respectively intended as a reprocessing face.

3. A faceted mirror apparatus, comprising: a faceted mirror having a plurality of mirror facets which reflect impinging rays in order to generate a beam of rays, wherein each of the mirror facets has a mirror surface with an optical axis, and the mirror facets are each fitted into reception bores of a support plate so that the optical axes of the mirror surfaces are respectively aligned in order to generate the beam of rays, each of the facets having an outer surface which bears directly on the inner wall of the reception bore to provide stable alignment of the facet within the reception bore, wherein the mirror facets are reprocessed on their back faces, remote from the mirror surfaces, with which they respectively bear on the step ledge of the reception bore.

4. A faceted mirror apparatus, comprising: a faceted mirror having a plurality of mirror facets which reflect impinging rays in order to generate a beam of rays, wherein each of the mirror facets has a mirror surface with an optical axis, and the mirror facets are each fitted into reception bores of a support plate so that the optical axes of the mirror surfaces are respectively aligned in order to generate the beam of rays, each of the facets having an outer surface which bears directly on the inner wall of the reception bore to provide stable alignment of the facet within the reception bore, the mirror facets each having a conical mirror facet head, with a mirror surface, and a cylindrical mirror facet base, the mirror facets being received in reception bores of the support plate with correspondingly matched conical and cylindrical shapes.

5. The apparatus of claim 4, wherein the conical region of the mirror facet head or the conical region of the reception bore is respectively intended as a reprocessing face.

6. The apparatus of claim 1, wherein the mirror facets are made of silicon.

7. The apparatus of claim 1, wherein the mirror facets are made of a stainless steel alloy.

8. The apparatus of claim 1, wherein the mirror facets each have a mirror facet head with a mirror surface, on which a marking is provided for azimuthal orientation.

9. The apparatus of claim 1, wherein a combination of spring elements and fastening elements is provided as fixing means for the mirror facets in the reception bores of the support plate.

10. The apparatus of claim 1, wherein the support plate is made of silicon.

11. The apparatus of claim 1, further, comprising:
an illumination instrument optically coupled to the faceted mirror to provide illumination incident upon the faceted mirror, and
a microlithography projection objective optically coupled to the faceted mirror to project an image formed using the beam of rays generated by the faceted mirror.

12. A faceted mirror apparatus, comprising: a faceted mirror having a plurality of mirror facets which reflect impinging rays in order to generate a beam of rays, wherein each of the mirror facets has a mirror surface with an optical axis, and the mirror facets are each fitted into reception bores of a support plate so that the optical axes of the mirror surfaces are respectively aligned in order to generate the beam of rays, each of the facets having an outer surface which bears directly on the inner wall of the reception bore to provide stable alignment of the facet within the reception bore, the mirror facets of the support plate having reprocessing faces for alignment of at least one mirror surface, said apparatus further comprising:
an illumination instrument optically coupled to the faceted mirror to provide illumination incident upon the faceted mirror,
a microlithography projection objective optically coupled to the faceted mirror to provide illumination incident upon the faceted mirror, and
a microlithography projection objective optically coupled to the faceted mirror to project an image formed using the beam of rays generated by the faceted mirror.

13. The apparatus of claim 12 wherein the mirror facets each have a cylindrical mirror facet head, with a mirror surface, and a cylindrical mirror facet base, and they are fitted into stepped reception bores of the support plate with a step ledge.

14. The apparatus of claim 13, wherein the step ledge of the stepped reception bore is respectively intended for alignment of the optical axis.

15. The apparatus of claim 13, wherein the mirror facets are intended for alignment of the optical axis on back faces, remote from the mirror surfaces, with which they respectively bear on the step ledge of the reception bores.

16. The apparatus of claim 12 wherein the mirror facets each have a conical mirror facet head with a mirror surface and a cylindrical mirror facet base, and they are received in reception bores of the support plate with correspondingly matched conical and cylindrical shapes.

17. The apparatus of claim 16, wherein the conical region of the mirror facet head or the conical region of the reception bore is respectively intended for alignment of the optical axis.

18. The apparatus of claim 12 wherein the illumination instrument provides illumination within a wavelength range of the extreme ultraviolet.

19. A faceted mirror apparatus, comprising:
a faceted mirror having a plurality of mirror facets which reflect impinging rays in order to generate a beam of rays, wherein each of the mirror facets has a mirror surface with an optical axis, and the mirror facets are each fitted into reception bores of a support plate so that the optical axes of the mirror surfaces are respectively aligned in order to generate the beam of rays, the reception bores having a step ledge, each of the facets having an outer surface which bears directly on the inner wall of the reception bore to provide a stable alignment of the facet within the reception bore;
an illumination instrument optically coupled to the faceted mirror to provide illumination impinging on the faceted mirror, and
a microlithography projection objective optically coupled to the faceted mirror to project an image formed using the beam of rays generated by the faceted mirror, the mirror facets each having a cylindrical mirror facet head, with a mirror surface, and a cylindrical mirror facet base, the mirror facets being fitted into stepped reception bores of the support plate with a step ledge.

20. The apparatus of claim 19, wherein the step ledge of the stepped reception bore is respectively intended for alignment of the optical axis.

21. The apparatus of claim 19, wherein the mirror facets are intended for alignment of the optical axis on back faces, remote from the mirror surfaces, with which they respectively bear on the step ledge of the reception bores.

22. The apparatus of claim 19, wherein the mirror facets each have a conical mirror facet head with a mirror surface and a cylindrical mirror facet base, and they are received in reception bores of the support plate with correspondingly matched conical and cylindrical shapes.

23. The apparatus of claim 22, wherein the conical region of the mirror facet head or the conical region of the reception bore is respectively intended for alignment of the optical axis.

24. A faceted mirror apparatus, comprising:
a faceted mirror having a plurality of mirror facets which reflect impinging rays in order to generate a beam of rays, wherein each of the mirror facets has a mirror surface with an optical axis, and the mirror facets are each fitted into reception bores of a support plate so that the optical axes of the mirror surfaces are respectively aligned in order to generate the beam of rays, each of the facets having an outer surface which bears directly on the inner wall of the reception bore to provide a stable alignment of the facet within the reception bore;
an illumination instrument optically coupled to the faceted mirror to provide illumination impinging on the faceted mirror, and
a microlithography projection objective optically coupled to the faceted mirror to project an image formed using the beam of rays generated by the faceted mirror, the mirror facets each having a conical mirror facet head with a mirror surface and a cylindrical mirror facet base, the mirror facets being received in reception bores of the support plate with correspondingly matched conical and cylindrical shapes.

25. The apparatus of claim 24, wherein at least one of the reception bores includes a step ledge for alignment of the optical axis of the mirror surface of the facet head which is received in said at least one of said reception bores.

26. The apparatus of claim 24, wherein at least one of the reception bores includes a step ledge and the mirror facets have faces, remote from the mirror surfaces, which bear on the step ledge of respective ones of the reception bores, the back faces being faces which have been reprocessed to bring about mutual alignment of the optical axes of the mirror surfaces of the mirror facets.

27. A facetted mirror having a plurality of mirror facets which generate a beam of rays, wherein each of the mirror facets has a mirror surface with an optical axis, and the mirror facets are each fitted to a support plate so that the optical axes of the mirror surfaces are respectively aligned in order to generate the beam of rays, the mirror facets or the support plate having reprocessing faces for the alignment of at least one mirror surface.

28. The facetted mirror as claimed in claim 27, wherein the mirror faces are each fitted into reception bores of the support plate.

29. The facetted mirror as claimed in claim 28, wherein the minor facets each have a cylindrical mirror facet head with a mirror surface and a cylindrical minor facet base, and they are fitted into stepped reception bores of the support plate with a step ledge.

30. The facetted mirror ac claimed in claim 29, wherein the step ledge of the reception bore is respectively intended as a reprocessing face.

31. The facetted mirror as claimed in claim 29, wherein the mirror facets are reprocessed on their back faces, remote from the mirror surfaces, with which they respectively bear on the step ledge of the reception bore.

32. The facetted mirror as claimed in claim 27, wherein the mirror facets each have a conical mirror facet head, with a mirror surface, and a cylindrical mirror facet base, and they are received in reception bores of the support plate with correspondingly matched conical and cylindrical shapes.

33. The facetted mirror as claimed in claim 32, wherein the conical region of the mirror facet head or the conical region of the reception bore is respectively intended as a reprocessing face.

34. The facetted mirror as claimed in claim 27, wherein the mirror facets are made of silicon.

35. The facetted mirror as claimed in claim 27, wherein the mirror facets are made of a stainless steel alloy.

36. The facetted minor as claimed in claim 27, wherein the minor facets each have a minor facet head with a mirror surface, on which a marking is provided for the azimuthal orientation.

37. The facetted mirror as claimed in claim 28, wherein a combination of spring elements and fastening elements is provided as fixing means for the mirror facets in the reception bores of the support plate.

38. The facetted mirror as claimed on claim 27, wherein the support plate is made of silicon.

39. A facetted mirror for generating an intended beam of rays from impinging rays, said facetted mirror, comprising:
a support plate, and
a plurality of mirror facets mounted to said support plate, each respective one of said mirror facets having a respective mirror surface with an optical axis, each respective optical axis lying in a set direction relative to said support plate such that, acting together, said mirror facets generate the intended beam of rays by reflecting the impinging rays from each respective one of said mirror surfaces in a respective predetermined direction, said facetted mirror having at least one reprocessing face, said at least one reprocessing face being located on at least one of (i) said mirror facet and (ii) said support plate; said at least one said reprocessing face being a reprocessing face which has been reprocessed to align at least one of said optical axes with said set direction.

40. A facetted mirror as claimed in claim 39, wherein said reprocessing face comprises a surface which has been reprocessed by being ablated in order to align said at least one of said optical axes with said set direction.

41. A facetted mirror as claimed in claim 40, wherein said surface comprises a surface from which a wedge shape has been ablated.

42. A facetted mirror as claimed in claim 39, wherein said reprocessing face comprises a surface which has been reprocessed by applying material thereto in order to align said at of least one of said optical axes with said set direction.

43. A facetted mirror as claimed in claim 42, wherein said surface comprises a surface to which said material has been applied in a wedge shape.

44. A facetted mirror as claimed in claim 39, further comprising: at least one reference face which serves as a reference for measuring said direction of at least one of said optical axes relative to said support plate, said reference facie being located on at least one of (i) at least one said mirror surface and (ii) said support plate.

45. A facetted mirror as claimed in claim 39, wherein said support plate includes a plurality of reception bores into which respective ones of said mirror facets are at least partially received.

46. A facetted mirror as claimed in claim 45, wherein said mirror facets each have a mirror facet head which includes a said mirror surface, respective ones of said mirror facet heads being received at least partially within respective ones of said reception bores.

47. A facetted mirror as claimed in claim 46, wherein each of said reception bores has a respective step ledge and wherein said at least one reprocessing face comprises at least one said step ledge.

48. A facetted mirror as claimed in claim 47, wherein each said mirror facet head comprises a back face located remote from said mirror surface of said mirror facet, each said mirror facet head being received at least partially within a said respective one of said reception bores such that at least a portion of said back face of said mirror facet head bears on said step ledge of said respective one of said reception bores.

49. A facetted mirror as claimed in claim 48, wherein said mirror facet head includes a cylindrical outer surface and wherein said mirror facets each further comprise a mirror facet base coupled to said back face.

50. A facetted mirror as claimed in claim 49, wherein said mirror facet base includes a cylindrical outer surface which has diameter which is smaller than a diameter of said cylindrical outer surface of said mirror facet head.

51. A. facetted mirror as claimed in claim 39, wherein said support plate includes a plurality of reception bores, each of said reception bores having an inner wall which includes a conical region and a cylindrical region and wherein said mirror facets each have a mirror facet head and a mirror facet base, each said mirror facet head including a conical outer surface, each said mirror facet base including a cylindrical outer surface, respective ones of said conical mirror facet heads being received at least partially in said reception bores such that a bearing region of said conical outer surface of each respective said mirror facet head bears against said conical region of said inner wall of a respective one of said reception bores.

52. A facetted mirror as claimed in claim 51, wherein said reprocessing face comprises at least a portion of at least one of: (i) said conical otter surface of said mirror facet head end, (ii) said conical region of said inner wall of said reception bore.

53. A facetted mirror as claimed in claim 39, wherein said mirror facets are made of silicon.

54. A facetted mirror as claimed in claim 39, wherein said mirror facets are made of a stainless steel alloy.

55. A facetted mirror as claimed in claim 39, wherein each of said mirror facets is provided with a marking indicating an azimuthal orientation of said mirror facet.

56. A facetted mirror as claimed in claim 39, wherein each said mirror facet is mounted to said support plate under a force provided by a spring element to hold said mirror facet in position with respect to said support plate.

57. A facetted mirror as claimed in claim 56, wherein said force provided by said spring element acts upon said mirror facet by way of a fastener element which is connected to said mirror facet.

58. A facetted mirror as claimed in claim 39, wherein said support plate is made of silicon.

* * * * *

UNITED STATES PATENT AND TRADEMARK OFFICE
CERTIFICATE OF CORRECTION

| | | |
|---|---|---|
| PATENT NO. | : 7,802,891 B2 | Page 1 of 2 |
| APPLICATION NO. | : 12/338049 | |
| DATED | : September 28, 2010 | |
| INVENTOR(S) | : Seifert et al. | |

It is certified that error appears in the above-identified patent and that said Letters Patent is hereby corrected as shown below:

On the title page, Item (75)
  delete "Stefan Dornheim, Heindenheim" and insert --Stefan Dornheim, Heidenheim--

Column 11, line 64
  delete "minor facets" and insert --mirror facets--

Column 11, line 65
  delete "minor facets" and insert --mirror facets--

Column 12, line 1
  delete "ac claimed" and insert --as claimed--

Column 12, line 21
  delete "minor" and insert --mirror--

Column, 12, line 22
  delete "minor" and insert --mirror--

Column 12, line 22
  delete "minor" and insert --mirror--

Column 12, line 29
  delete "on claim" and insert --in claim--

Column 12, line 65
  delete "reference facie" and insert --reference face--

Column 13, line 29
  delete "A. facetted" and insert --A facetted--

Signed and Sealed this
Twelfth Day of July, 2011

David J. Kappos
*Director of the United States Patent and Trademark Office*

CERTIFICATE OF CORRECTION (continued)
U.S. Pat. No. 7,802,891 B2

Column 14, line 12
    delete "otter surface" and insert --outer surface--